United States Patent
Phan et al.

[11] Patent Number: 5,985,497
[45] Date of Patent: Nov. 16, 1999

[54] METHOD FOR REDUCING DEFECTS IN A SEMICONDUCTOR LITHOGRAPHIC PROCESS

[75] Inventors: Khoi A. Phan, San Jose; Gurjeet S. Bains, Yuba City; David A. Steele, Sunnyvale, all of Calif.; Jonathan A. Orth, Essex Junction, Vt.; Ramkumar Subramanian, San Jose, Calif.

[73] Assignee: Advanced Micro Devices, Inc., Sunnyvale, Calif.

[21] Appl. No.: 09/017,678

[22] Filed: Feb. 3, 1998

[51] Int. Cl.⁶ .................................................. G03F 9/00
[52] U.S. Cl. ............................................ 430/30; 382/149
[58] Field of Search ................................ 430/30; 382/149

[56] References Cited

U.S. PATENT DOCUMENTS

| | | | |
|---|---|---|---|
| 5,736,281 | 4/1998 | Watson | 430/30 |
| 5,817,445 | 10/1998 | Bae | 430/30 |
| 5,871,874 | 2/1999 | Tounai | 430/30 |

*Primary Examiner*—Christopher G. Young

[57] ABSTRACT

An arrangement for optimizing a lithographic process forms a pattern on a silicon wafer using a photocluster cell system to simulate an actual processing condition for a semiconductor product. The resist pattern is then inspected using a wafer inspection system. An in-line low voltage scanning electron microscope (SEM) system reviews and classifies defect types, enabling generation of an alternative processing specification. The alternative processing specification can then be tested by forming patterns on different wafers, and then performing split-series testing to analyze the patterns on the different wafers for comparison with the existing lithographic process and qualification for production.

18 Claims, 14 Drawing Sheets

METHOD FOR REDUCING DEFECTS IN A SEMICONDUCTOR LITHOGRAPHIC PROCESS

BACKGROUND OF THE INVENTION

1. Technical Field

The present invention relates to techniques for detecting and reducing defects formed on a wafer during submicron lithography.

2. Description of the Related Art

Manufacturing processes for submicron integrated circuits require strict process control for minimizing defects on integrated circuits. Defects are the primary "killers" of devices formed during manufacturing, resulting in yield loss. Hence, defect densities are monitored on a wafer to determine whether a production yield is maintained at an acceptable level, or whether an increase in the defect density creates an unacceptable yield performance. Hence, the detection and monitoring of defects is critical to maintaining an acceptable yield.

As device geometries shrink into the sub-half micron regime, controlling and reducing defect levels become increasingly important in both research and development and manufacturing environments. Any delay in addressing the causes and cures of these yield killers can prolong the development cycle and production release of new product technologies. However, defect evaluation for a new lithography process on product wafers is difficult due to metrology limitation, substrate noises and previous layer defects. This problem is particularly pronounced for backend layers where differences in the metal grain sizes and reflectivity can confound defect inspection tools and can be picked up as false defects. Often yield learning is long delayed awaiting sort data, before lithographers can determine the beneficial effects of proposed manufacturing improvements.

During the qualification stage of a new process technology or a new product, a minimum sort yield level (typically 15 to 20%) must be achieved in order for the new product or the new process to be considered production worthy. Often, managers use the early yield indicator to decide whether to utilize a new product design or a new process technology. However, IC device yield is largely influenced by defects in the fabrication process. Defects are commonly divided into two categories by yield engineers: systematic and random. Systematic defects are anomalies resulting from an unoptimized process flow, from design rule violations or a mismatch between process and design in the worst case. However, once a systematic defect is identified, its impact on product yield and performance is predictable and therefore can be corrected within a short time. On the other hand, random defects are due to contamination from process and equipment. They occur irregularly and tend to be unpredictable. Elimination of these random defect excursions, if not controlled and monitored properly, become more difficult and can confound systematic yield issues. If random defects cannot be reduced in a timely manner, a new process can be jeopardized and consequently lead to a delay in new product introduction.

In the photolithography area, in-line defect monitoring of production wafers becomes more difficult with each successive masking layer. Film sensitivities, topographic effects and previous layer defects can make the determination of the existence or magnitude of photo process defect occurrence almost impossible. This is particularly true for the backend process where multi-layer metallization and chemical mechanical polish (CMP) are used. The effort to optimize a lithographic process can be statistically insignificant due to small sample size, or inconclusive if impacted by other non-photo variables.

DISCLOSURE OF THE INVENTION

There is a need for an arrangement for reducing defects in a semiconductor fabrication process, more specifically an arrangement for optimizing a lithographic process to reduce defects and to qualify the optimized lithographic process for production.

There is also a need for an arrangement for detecting random defects occurring during photolithography processing, and for monitoring the random defects to optimize the lithographic process.

These and other needs are attained by the present invention, where a semiconductor fabrication process, for example an I-line lithographic process, is optimized, where a pattern formed on a silicon wafer using a semiconductor fabrication process simulating a prescribed processing specification is inspected for defects. The detected defects are then classified, enabling generation of an alternative processing specification. The alternative processing specification is then tested by forming patterns on different wafers using the attenuated processing specification (e.g., split-series testing), and then analyzing the patterns on the different wafers relative to the prescribed processing specification. The testing thus enables qualification of the alternative processing specification for production of semiconductor products.

According to one aspect of the present invention, a method of reducing defects in a semiconductor fabrication process comprises forming a pattern on a first silicon wafer using the semiconductor fabrication process according to a prescribed processing specification, inspecting the pattern on the first silicon wafer to detect a first defect, developing an alternative processing specification relative to the prescribed processing specification based on the first defect, forming the pattern on a second silicon wafer using the semiconductor fabrication process according to the alternative processing specification, comparing respective characteristics of the patterns on the first and second silicon wafers, and changing the lithographic process to include the alternative processing specification based on the comparing step. The formation of the pattern on the first silicon wafer using the semiconductor fabrication process according to the prescribed processing specification enables precise analysis of the prescribed processing specification forming the pattern, without introducing additional variables that may otherwise be present during fabrication of a complete integrated circuit product. In addition, the inspecting of the pattern on the first silicon wafer to detect a first defect may be implemented as a short loop test, where defect causes related to the prescribed processing specification can be efficiently identified, including both killer defects directly affecting yield and non-killer defects that do not necessarily cause potential yield problems but which may affect defect stability. The comparison of the respective characteristics of the patterns on the first and second wafers also enables the alternative processing specification to be qualified relative to the prescribed processing specification in an efficient manner.

Another aspect of the present invention includes a method of reducing defects in a lithographic process, comprising forming a resist pattern on a first silicon wafer using the lithographic process according to a prescribed processing specification, inspecting the resist pattern on the first silicon wafer to detect a first defect, developing an alternative processing specification relative to the prescribed processing specification based on the detected first defect, forming the resist pattern on a second silicon wafer using the lithographic process according to the alternative processing specification, comparing respective characteristics of the resist patterns on the first and second silicon wafers, and changing the lithographic process to include the alternative processing specification based on the comparing step. Inspection of the resist pattern on the first silicon wafer provides precise analysis of the prescribed processing specification for the lithographic process, enabling rapid identification of defect causes for corrective action. In addition, comparing the respective patterns (e.g., split-series testing) enables rapid verification of the corrective action and qualification of the alternative processing specification for production.

Still another aspect of the present invention provides a system for reducing defects in a photolithography manufacturing process, comprising a photocluster cell system configured for simulating the photolithography process for a product to be manufactured, the photocluster cell system forming a pattern related to a prescribed design product rule on a silicon wafer, a wafer inspection system for detecting defects on the repetitive pattern based on image-based comparisons between adjacent patterns of the repetitive pattern, a defect review system for classifying the detected defects by respective types and causes, and a database system configured for identifying each defect by name and defect type, the database system configured for storing a prioritized list of the defect causes.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein.

BEST MODE FOR CARRYING OUT THE INVENTION

The disclosed embodiment is directed to a methodology for optimizing an I-line lithographic process with the aid of a photo defect monitor. A description will first be given of the arrangement for optimizing a lithographic process for defect reduction, for example I-line process or alternatively deep UV (DUV) process, followed by experimental results used to develop a new resist process for use in backend layers of 0.25 micron process technology.

Figure 1:
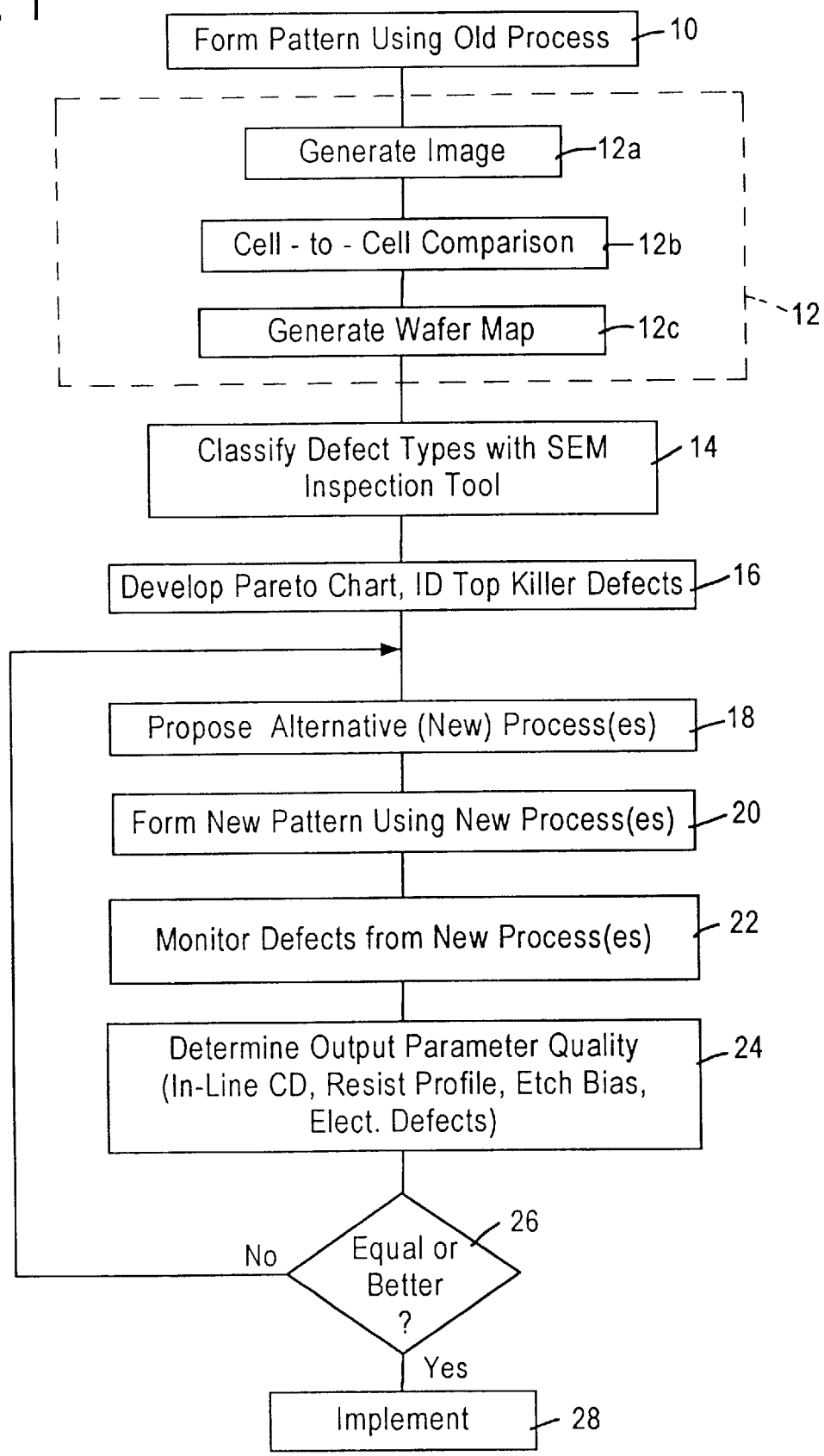
FIG. 1 is a flow diagram illustrating the method for reducing defects in a photolithography manufacturing process according to an embodiment of the present invention.
Figure 2:
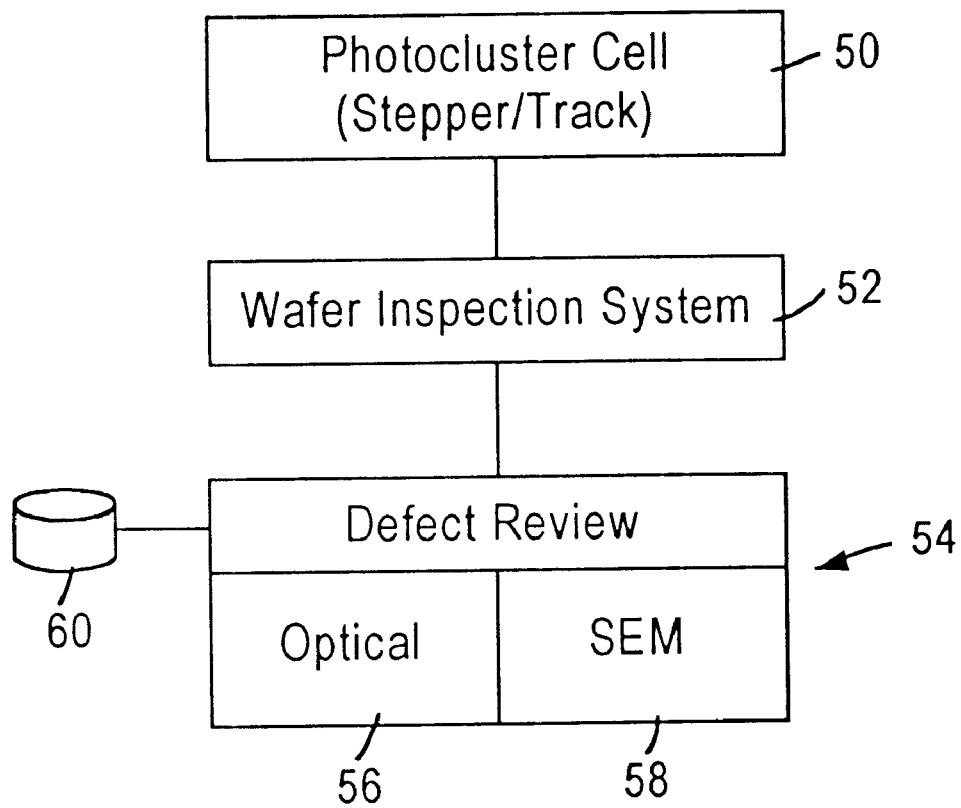
FIG. 2 is a block diagram illustrating a system for reducing defects in a photolithography manufacturing process according to an embodiment of the present invention.

FIG. 1 is a flow diagram summarizing the methodology for optimizing an I-line lithographic process for defect reduction according to an embodiment of the present invention. FIG. 2 is a block diagram illustrating the system for reducing the defects in the photolithography manufacturing process, configured for executing the method of FIG. 1 according to an embodiment of the present invention.

The system of FIG. 2 includes a photocluster cell system 50 configured for simulating a photolithography process for a product to be manufactured. Specifically, the photocluster cell 50 is FIG. 2 is configured for simulating the actual processing conditions for a product, for example using I-line photolithography. Depending on the application, the photocluster cell (stepper/track) 50 may be configured for deep ultraviolet (DUV) applications.

The system also includes a the wafer inspection system 52, for example a KLA 2132 model wafer inspection system, that detects defects on the repetitive pattern formed by the photocluster cell 50 based on image-based comparisons between adjacent patterns of the repetitive pattern. The detected defects are then reviewed by a defect review system 54, configured for classifying the detected defects by respective types and causes. As shown in FIG. 2, the defect review system 54 includes an optical defect review system 56, for example a Leica MIS-200, or a KLA 2608. The defect review system 54 also includes a low voltage SEM system, for example a JEOL 7700 or 7500 model. The optical defect review system 56 is used to complement the SEM system 58 for throughput, and may also be used to review defects that are not visible under the SEM system 58, for example a previous layer defect. A TDI camera on the KLA may also be used for viewing digitized defect images, as well as if the defect is not visible under both E-beam and white light microscopes.

The defect review system 54 develops a table of defect codes to assign a name to each type of defect. The defect review system 54 is then capable of developing a pareto chart of defect types in order to prioritize the defect types and causes. The defect coordinate file from the wafer inspection system 52 can be stored with the reviewed and classified defects in a database 60, enabling the database system to generate a prioritized list of defect causes as data is accumulated.

Figure 5A:
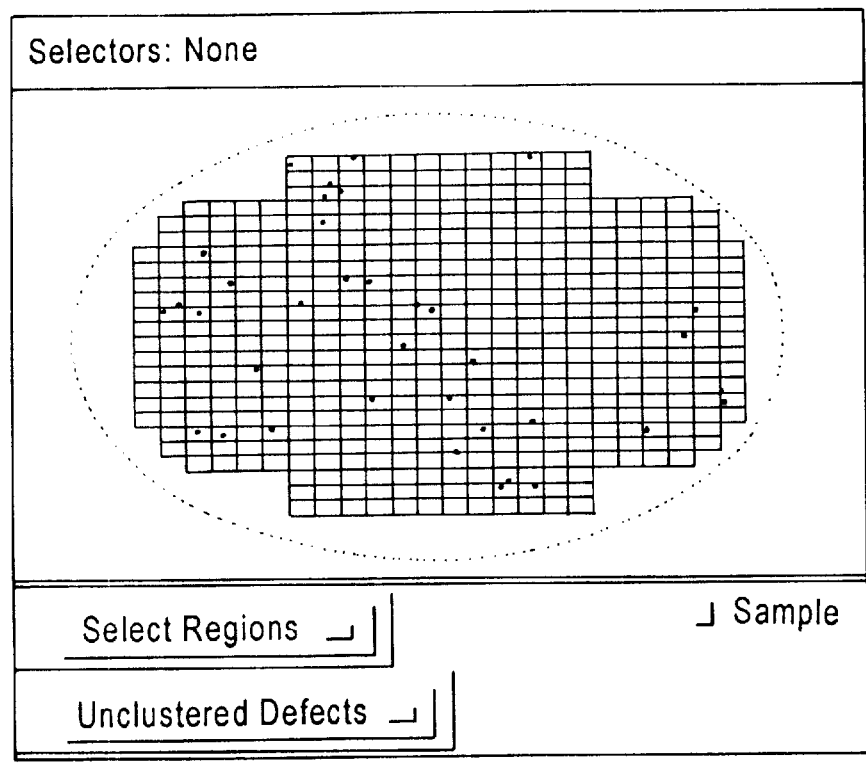
FIGS. 5A, 5B and 5C are exemplary pattern defect comparisons for troubleshooting variations in a development process.
Figure 5B:
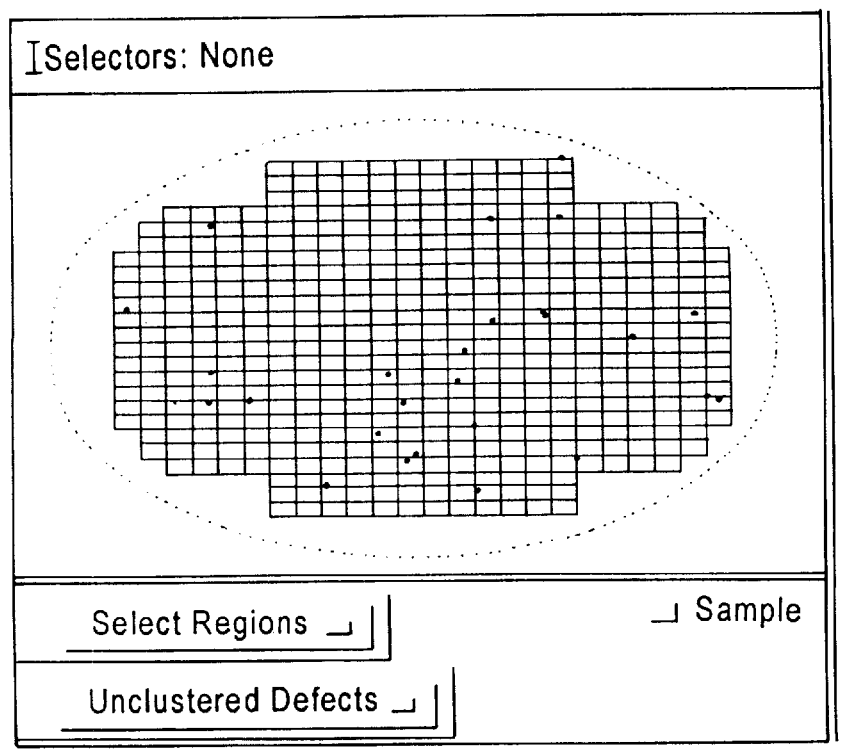
Figure 5C:
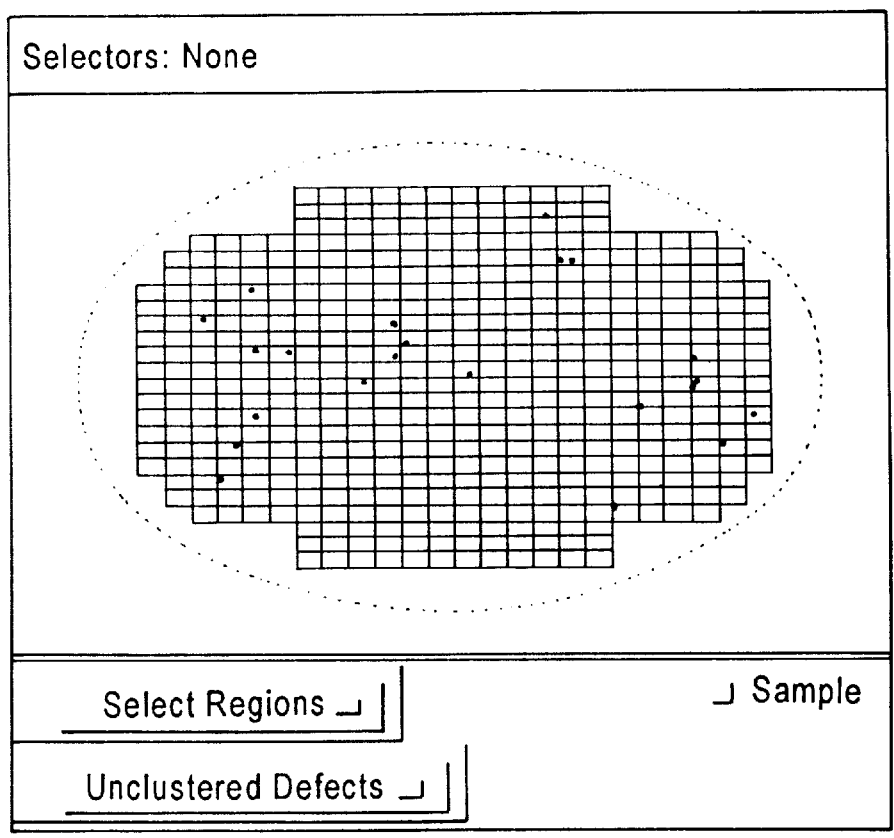

As shown in FIG. 1, the photocluster cell system 50 forms a resist pattern on a clean silicon wafer in step 10 according to a prescribed processing specification, also referred to as the "old process." The wafer inspection system 52 then inspects the resist pattern on the first silicon wafer to detect defects in step 12. Specifically, a pixel image of the photoresist pattern is generated in step 12a, for example by setting the KLA 2132 in array mode or cell-to-cell and at the lowest qualified pixel size for the tool (e.g., 0.25 or 0.39 micron pixel). Also, the wafer inspection system 52 is preferably optimized to limit false or non-visual defects to less than 5%. A cell-to-cell comparison between adjacent patterns of the repetitive pattern is then performed in step 12b, where the wafer inspection system 52 detects defects by differences in pixel images between adjacent pattern types. Hence, the wafer inspection system 52 can detect a defect based on a cell-to-cell comparison of a photo resist line by performing an image-based comparison with adjacent photo resist lines for differences. Following the cell-to-cell comparison throughout the patterns on the wafer, the wafer inspection system generates a wafer map in step 12c, for example as shown in FIGS. 5A, 5B and 5C.

Following generation of the wafer map by the wafer inspection system 52, the wafer inspection system 52 forwards the wafer and the generated defect coordinate file specifying the wafer defect map to the defect review system 54. The defect review system 54 uses the low voltage SEM system 58 to review and classify defect types in step 14. The optical review system 56 may also be used to complement the SEM system 58 for throughput, as well as detecting defects (e.g., previous layer defects that are not visible under an electron beam.

Once defect types are reviewed and classified, a pareto chart can be developed in step 16 by the defect review system 54, enabling yield engineers to identify the top killer defects and their associated causes. This information can then be used to change process variables in the prescribed processing specification (i.e., the "old process") in an attempt to lower the defect rate encountered during the old process in step 10. A change in process variables will result in a proposal of at least one alternative process having an alternative processing specification in step 18 for lowering the defect rate. Once alternative processes have been proposed by changing different process variables, several develop splits may be performed in step 20, where new patterns are formed on new silicon wafers using the alternative processes (i.e., "new process") in order to evaluate the effect of the changed process variables on formation of the same pattern as manufactured in step 10.

The patterns formed from the develop splits in step 20 are then analyzed over time in step 22 using the same methodology as described above with respect to steps 12 and 14 in order to monitor the defects generated using the new process over time. In addition to comparing the defects on the patterns formed under the new process over time, the output parameter quality of the patterns under the new process are compared in step 24 with the old process to determine whether the output parameter quality of the patterns under the new process are comparable to the patterns formed under the old process. For example, comparison in patterns formed under the old process and the new process may be made with respect to in-line critical dimensions (CD), resist profile, etch bias, and detecting the presence of any electrical defects on the resist pattern (e.g., short and open circuit tests, yield of the interconnect pattern, etc.). The defect density rate and the output parameter quality for each of the old and new processes are compared to determine whether the proposed alternative process provides an improved yield and at least a comparable output parameter quality. If in step 26 the proposed new process provides an improved yield and a comparable output parameter quality, the proposed new process can be implemented in step 28. If in step 26 the yield of the alternative new process is not improved, or if the output parameter quality is not comparable to the old process, then an alternative process would need to be developed (step 18). As is readily apparent from the foregoing, several alternative processes may be proposed simultaneously to enable the troubleshooting analyses to be performed in parallel, minimizing the length of time needed to qualify one of the candidate processes.

EXPERIMENTAL RESULTS

The above-described arrangement for FIGS. 1 and 2 was successfully implemented to improve an I-line lithographic process. The following description describes the results of using the above-described arrangement for defect reduction.

The above-described embodiment was used to analyze post-develop residues associated with a new I-line resist for backend masking layers for the 0.25 micron technology. During the troubleshooting process (steps 18, 20, 22, 24, 26), several develop splits were performed and led to a low defect develop process. The new develop process has triple puddles and double water rinses as compared to the double puddles/single rinse in the standard process (step 10). Further study was done on the new develop process. KLA defect monitors were performed over a long period to check the defect level of the new process for stability. After the low defect density was confirmed, CD and resist profiles for the old and new develop processes were collected for comparison. Electrical parameters from metal defect monitor short loop were compared as well. An example of a non-killer defect will be described below. By reviewing with a TDI camera on a KLA 2132, water stain droplets from SEM observation were found to match TDI defect images on the KLA 2132. These defects, unobservable with a regular optical microscope or high magnification SEM, have no effect on pattern definition after etch. Further optimization of DI water rinse and dry steps in the new develop process eliminated these water stains. Finally, the defect trend chart of the final process, described below, shows an improvement in defect density. Hence, a low defect develop process has been achieved with equal performance for all other criteria as the old process.

PHOTO DEFECT MONITOR PROCEDURE

The Photo Defect Monitor is a short loop test, processed through the photocluster cell (Stepper/Track) 50 just as the products are under real processing conditions. Then, these defect monitor wafers were inspected on a wafer inspection system for pattern comparator like the KLA 2132 to find defects. A low voltage SEM system like the JEOL 7700 or 7500 was used to review/classify defect types. Clean bare silicon wafers with an initial defect count below 10 were used for the defect monitor. They were processed through the stepper/track equipment with the same resist process as the products. For maximum KLA sensitivity and high inspection throughput, a clear field reticle with repeating pattern and similar design rule to the product was used. The stepper exposure and focus settings were optimized for bare silicon substrate to avoid defects induced due to non-optimal processing condition. The inspection mode on the KLA 2132 was done in array or cell-to-cell and at the lowest qualified pixel size for the tool (usually 0.25 or 0.39 um pixel, for 95% capture rate). The inspection program was optimized to limit false or non-visual defects to less than 5%. After defects were found on the KLA, the wafer with its defect coordinate file was then transferred to a low voltage JEOL SEM 7500 or 7700 system for reviewing and classifying. A table of defect codes was used to assign a name to each type of defect. Then, a pareto chart of defect types could be plotted. From there, lithography engineers could determine which top killer defects need to be eliminated. Optical defect review systems like the Leica MIS-200 or the KLA 2608 were used to complement the SEM system for throughput and whenever a defect was not visible under the E-beam (previous layer defect). A TDI camera on the KLA was employed for viewing digitized defect images as well if a defect was not visible under both E-beam and white light microscopes.

POST-DEVELOP RESIDUE DEFECTS

Figure 3B:
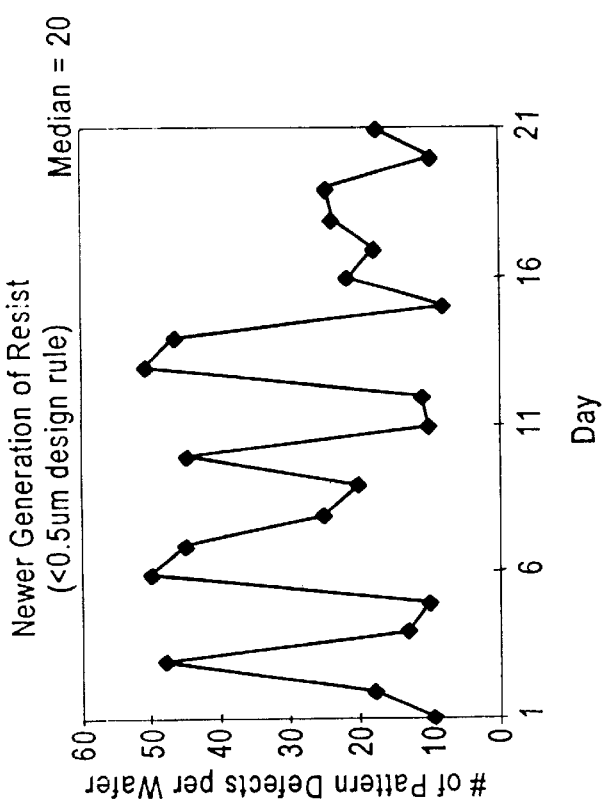
FIGS. 3A and 3B are defect trend charts illustrating defect trends according to first and second design rules, respectively.
Figure 3A:
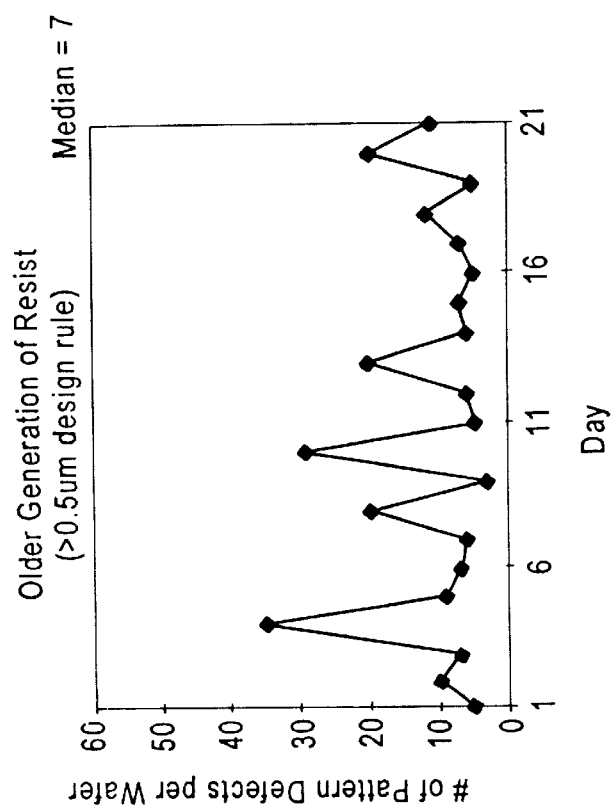
Figure 4A:
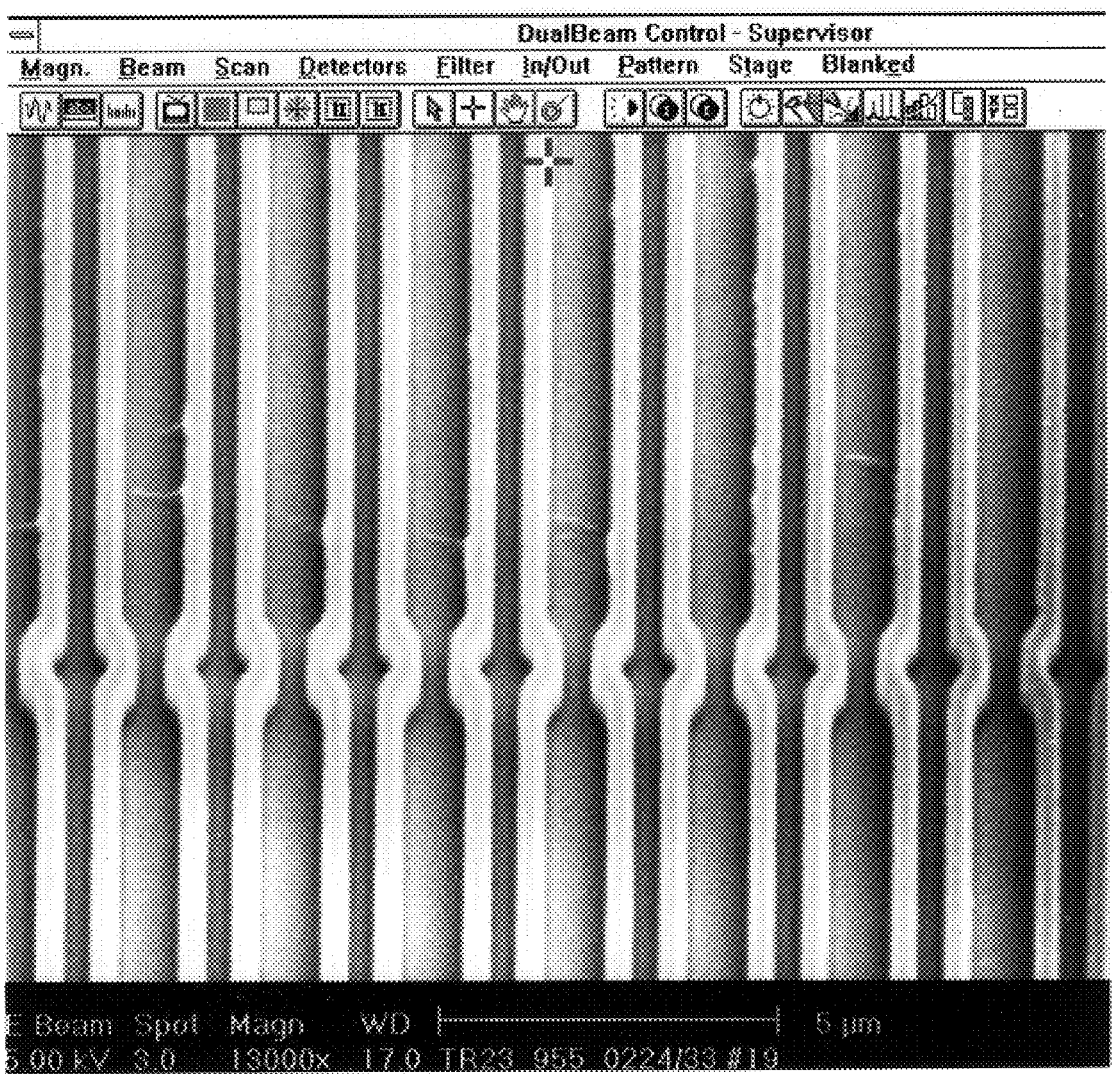
FIGS. 4A and 4B are scanning electron microscope (SEM) micrographs illustrating pattern defects.
Figure 4B:
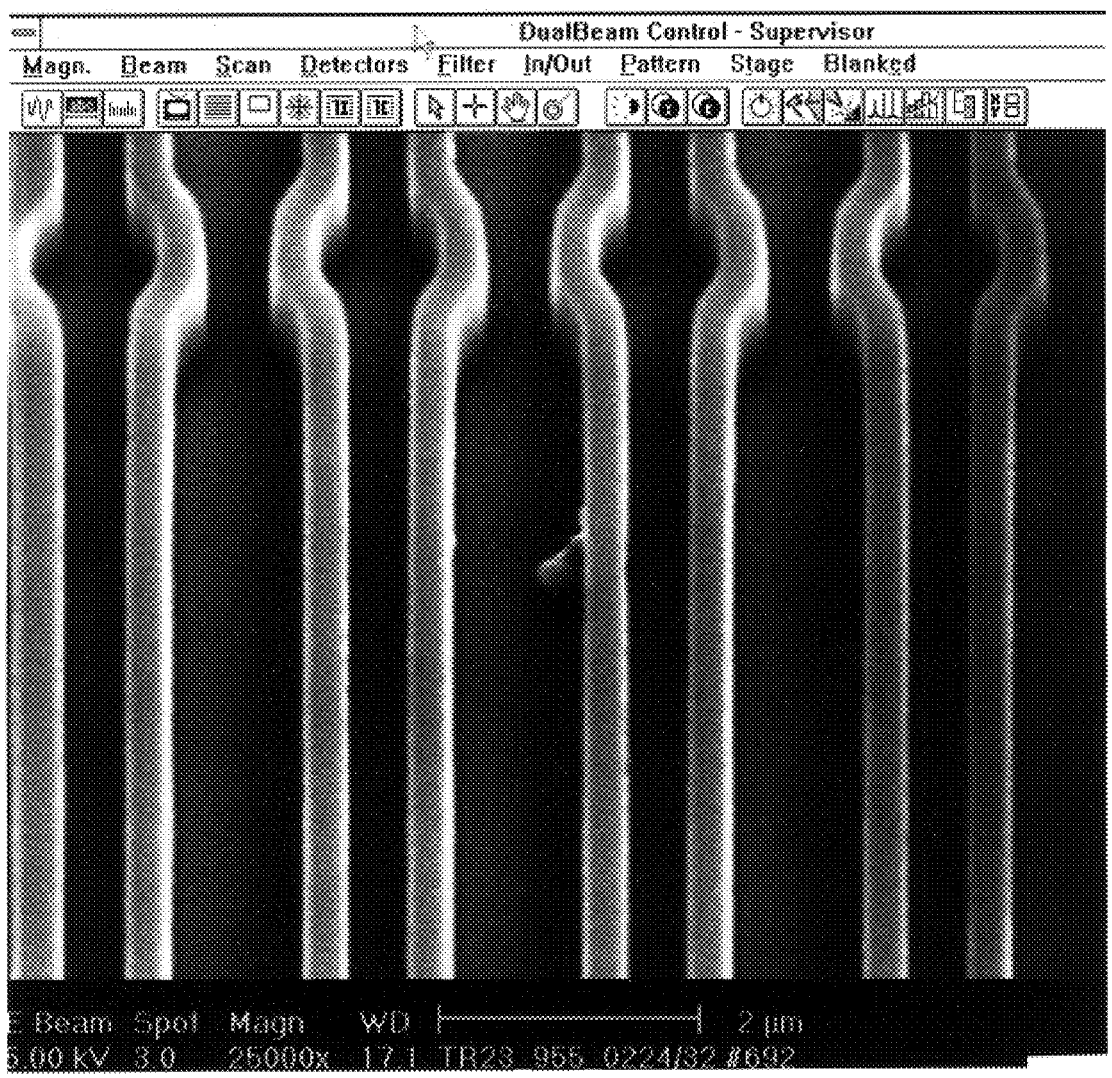

FIG. 3A shows the KLA defect trend chart for on old generation of I-line resist used for devices with the design rule greater than 0.5 um. FIG. 3B shows the corresponding KLA defect trend chart for a new generation of I-line resists for products with the design rule below 0.5 um. This new I-line resist is to be used in the backend layers (metal, contact). Both resist systems use the same TMAH developer and with the same normality. The two defect trend charts in FIGS. 3A and 3B are from the same photocluster cell. It has been observed that the new resist's defect control limit (median) was more than double the old resist's control limit over the same period of time. During the defect review on SEM, most of the defects in the new resist system were categorized as post develop residue (FIGS. 4A and 4B). On the contrary, these post develop reside defects had not been observed in the old system.

This discovery has led to the develop process optimization for our new resists. The following description refers to the new resist and its develop processes to avoid confusion with the process for the old resist.

DEVELOP PROCESS OPTIMIZATION FOR LOW DEFECT

The standard develop process for the new I-line resist for the 0.25 um backend process technology comprises two short puddles (15"/15") and a single DI water rinse. The developer was a surfactant added TMAH developer with 0.23 N normality. The track equipment used was the TEL Mark 7 system. Post-exposure bake was done prior to develop to smooth out resist standing waves. Prior to the puddle formation a DI water prewet was applied to make the wafer surface hydrophilic in order to avoid trapping bubbles. A hard bake was applied to the wafer after develop. As shown in FIGS. 4A and 4B, post develop residues were observed with this develop process. These defects were believed to occur due to the redeposition of dissolved photoresist solids back onto the wafer surface during processing. In the low impact developer processes now favored by the industry, for better CD control, this problem becomes more severe because of the lack of scrubbing or agitation.

Figure 6A:
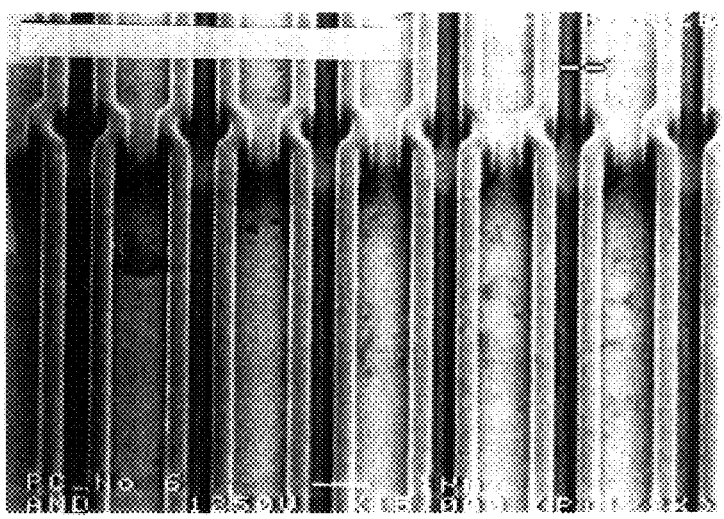
FIGS. 6A, 6B and 6C are exemplary SEM micrographs of defects for the three process variations of FIGS. 5A, 5B and 5C, respectively.
Figure 6B:
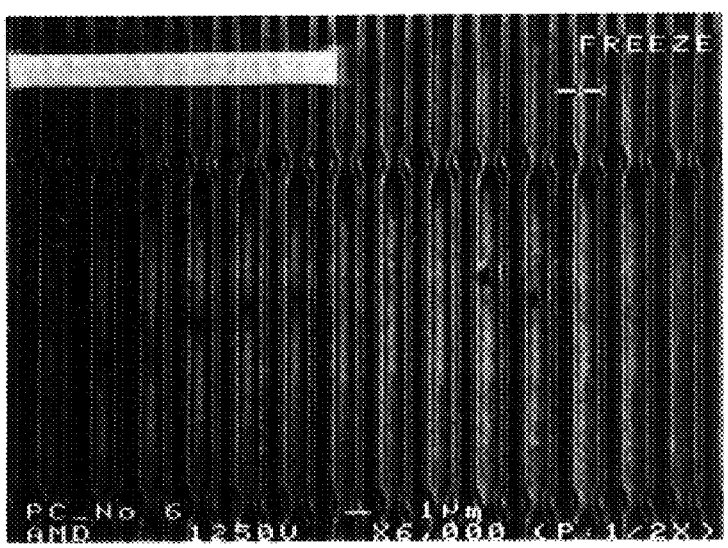
Figure 6C:
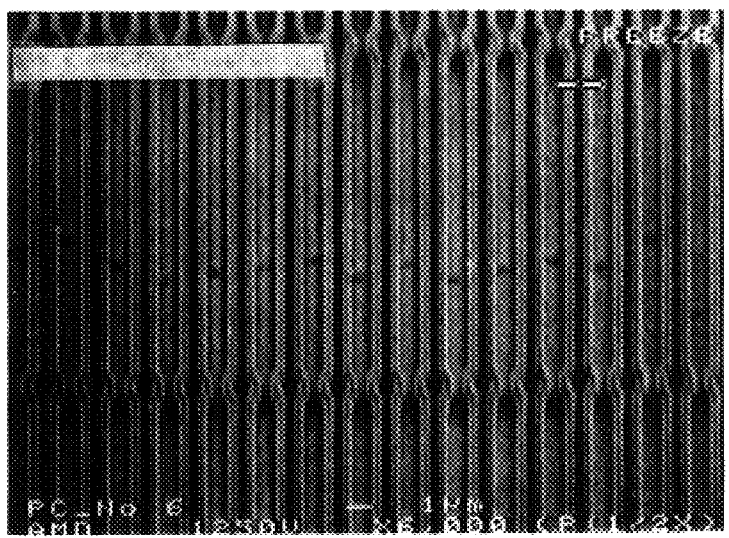

Since develop times are preferably very short (15"/15") (i.e., 15 seconds/15 seconds) for throughout consideration, it was initially thought that short develop time was responsible for these defects. A 3-way develop time split for the double puddles was done at 15"/15", 20"/20", and 25"/25". However, KLA defect monitor maps showed little difference between these 3 develop time splits (see FIG. 5A, 5B, 5C). SEM defect pictures also showed the same develop residue in all 3 splits (FIG. 6A, 6B, 6C). This led to the conclusion that develop time has little correlation to defect density.

Figure 7:
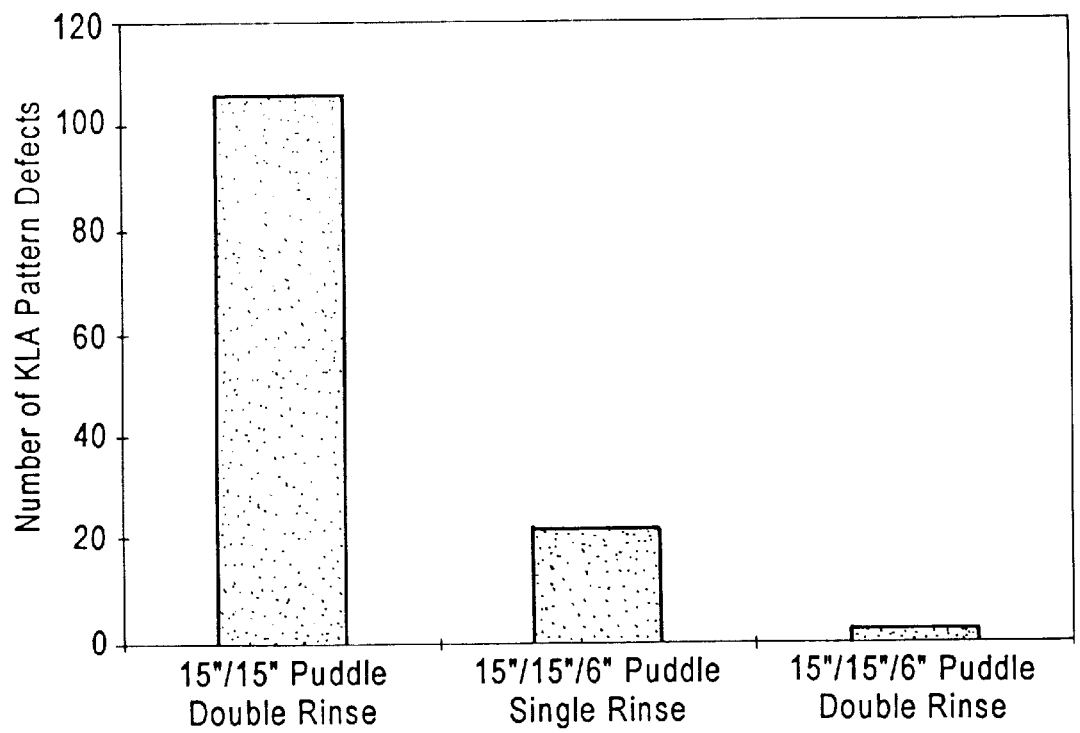
FIG. 7 is an illustrative defect comparison between different develop processes.
Figure 8:
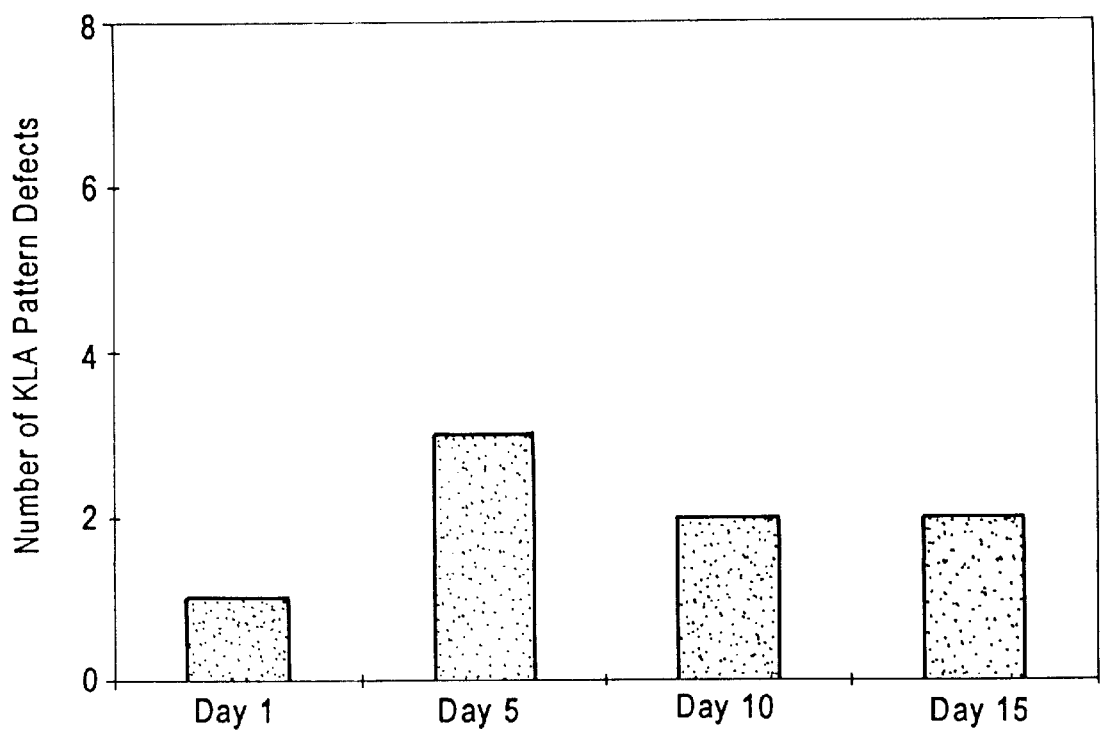
FIG. 8 is an exemplary evaluation of an alternative processing specification by comparing pattern defects over time.

A major concern is a phenomenon referred to as pH shock. This usually occurs during the transition from a puddle step to a rinse step. At the end of the puddle step, particularly in single puddle processes, the developer is a saturated solution of dissolved resist solids. This rapid addition of DI water to the puddle changes its ability to keep the solids in solution. The DI water causes the resist solids to precipitate back onto the wafer surface. Once there, the electrostatic attraction of the particles to the resist surface makes them difficult to remove by normal rinse techniques. We then proceeded to experiment with varying the number of develop puddles and rinses. A short third puddle step (6") was added, designed to shed at the end of the puddle the bulk of the developer off the wafer prior to rinse. This was to reduce the risk and potential amount of redeposition. Next, a full two rinse cycle was employed to more effectively remove adhered particles. The rinse cycles incorporated a special high/low spin speed design to spin particles off the wafer surface quickly at the beginning of the rinse step. FIG. 7 shows the KLA defect monitor map comparison between 3 develop processes: a standard double puddle (15"/15") but with a double rinse cycle, a triple puddle (15"/15"/6") with a single rinse cycle and a triple puddle (15"/15"/6") with a double rinse cycle. The triple puddle/double rinse exhibited the lowest defect count. We then proceeded to run multiple defect monitors over several days with this new process. The KLA defect counts were always low and consistent with this triple puddle/double rinse develop process (see FIG. 8). Now, a new develop process with low defect density has been found. We proceeded next to evaluate other process variables (in-line SEM CD, resist profile, electrical defect monitor) for comparison with the standard process. Since the standard develop process met other requirements (CD, etch bias, etc.) for backend layers, we needed to show this new develop process to have at least the same or equivalent results.

QUALIFICATION OF THE NEW DEVELOP PROCESS

Figure 9B:
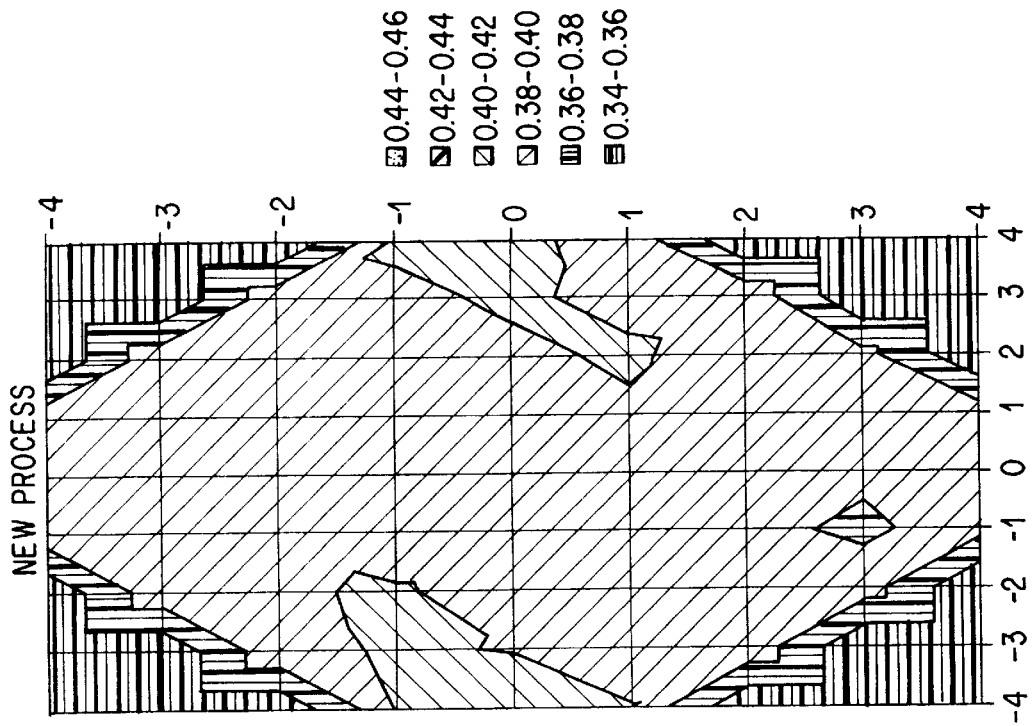
FIGS. 9A and 9B are SEM micrographs illustrating a comparison of inline critical dimensions for an old and new develop process, respectively.
Figure 9A:
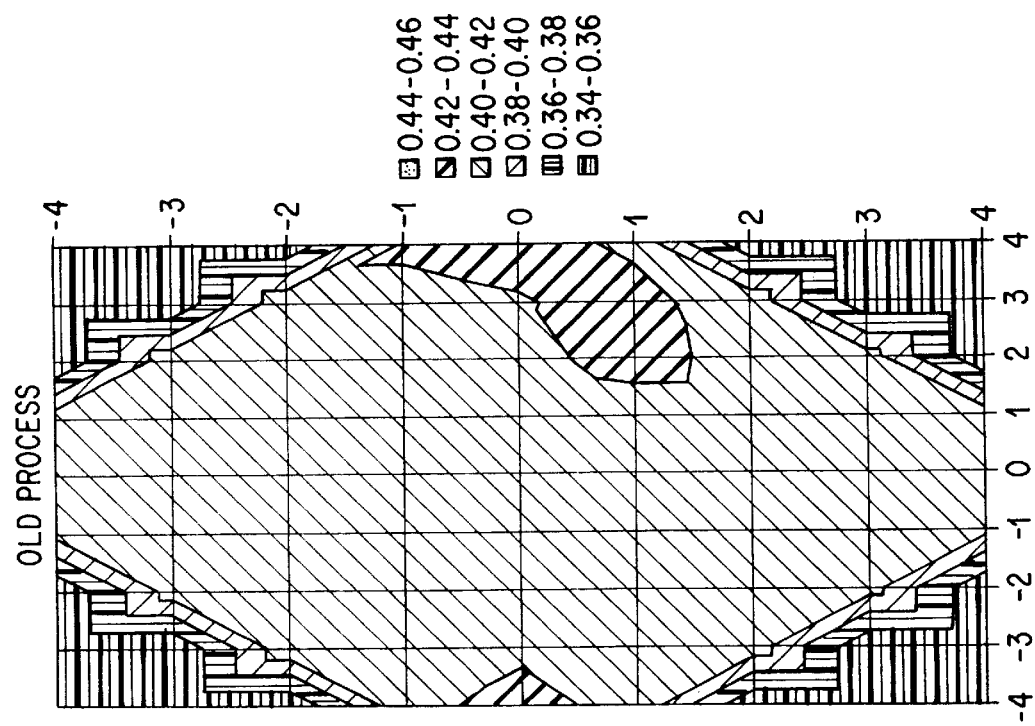
Figure 10A:
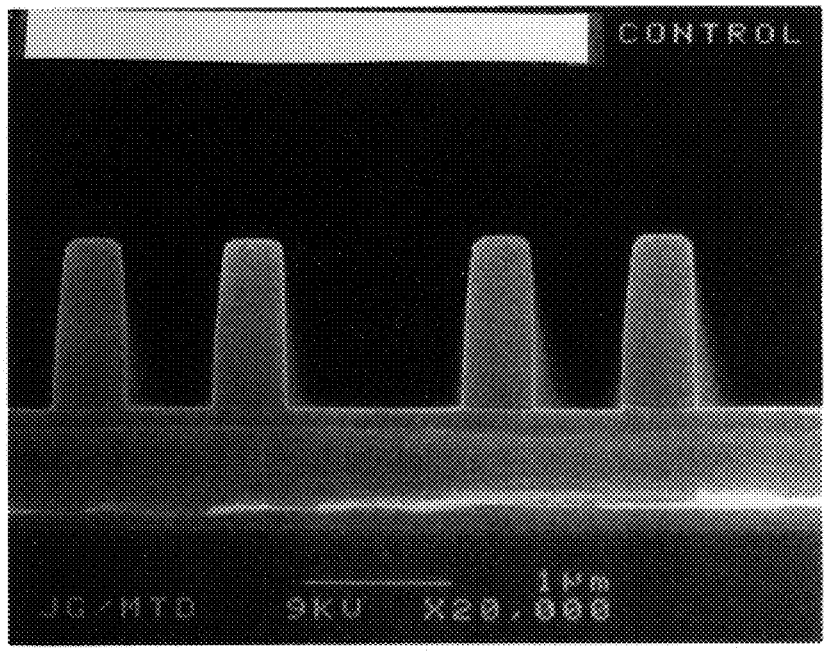
FIGS. 10A and 10B are SEM micrographs of resist profiles for an existing develop process and a proposed alternative developing process, respectively.
Figure 10B:
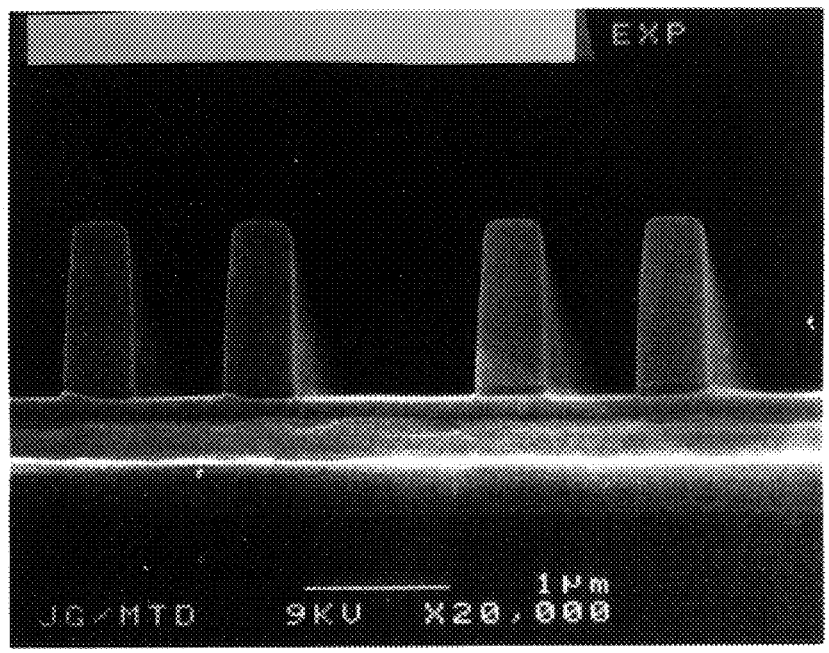
Figure 11:
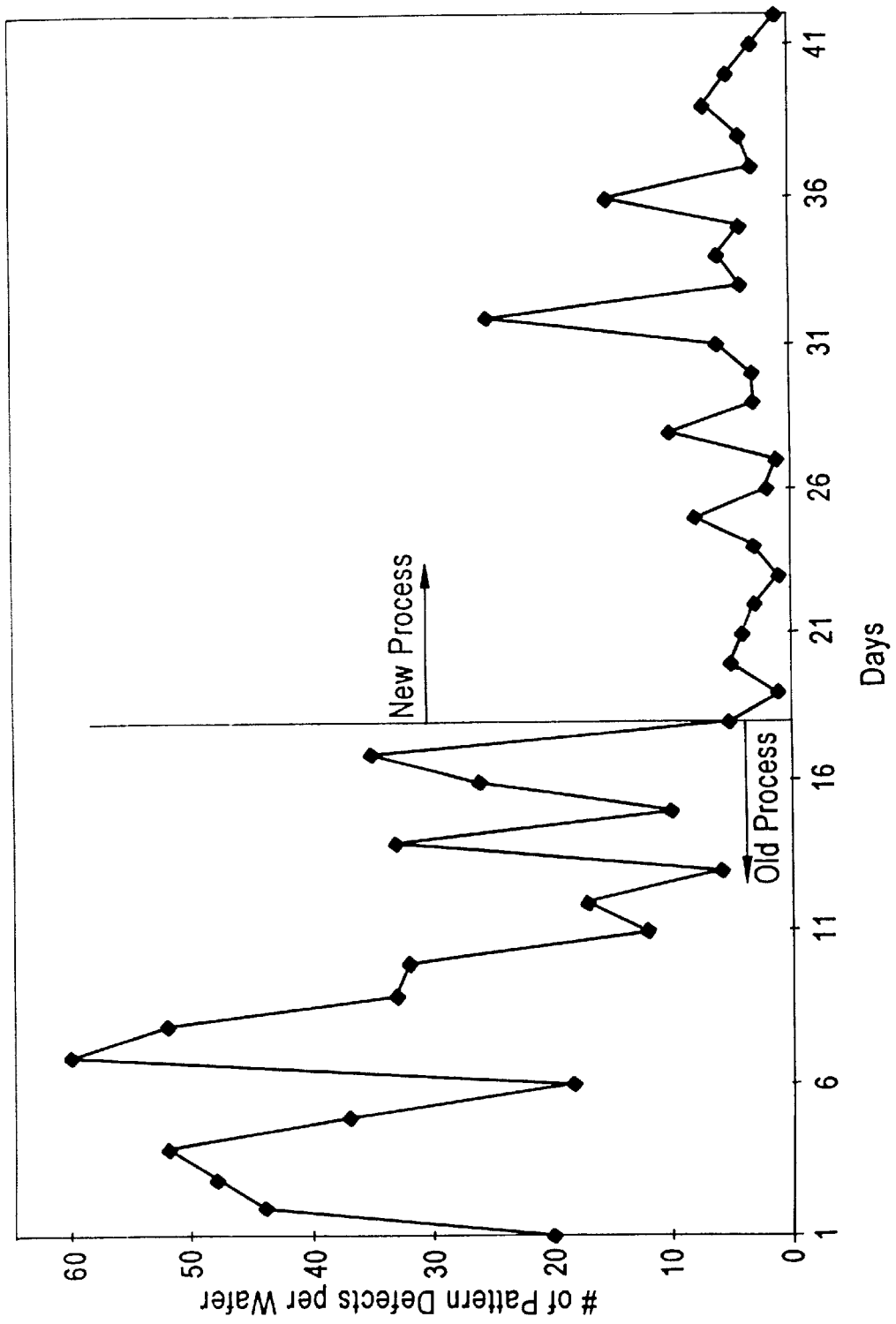
FIG. 11 is a drawing illustrating the number of pattern defects per wafer with respect to an old developer process and a new developer process.
Figure 12A:
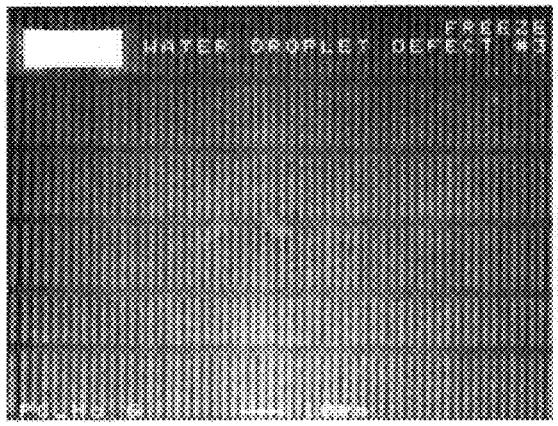
FIGS. 12A–12D are SEM micrographs illustrating non-killer defects according to an old processing specification.
Figure 12B:
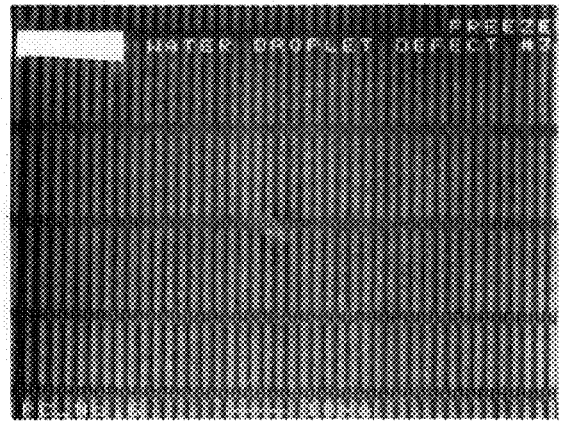
Figure 12C:
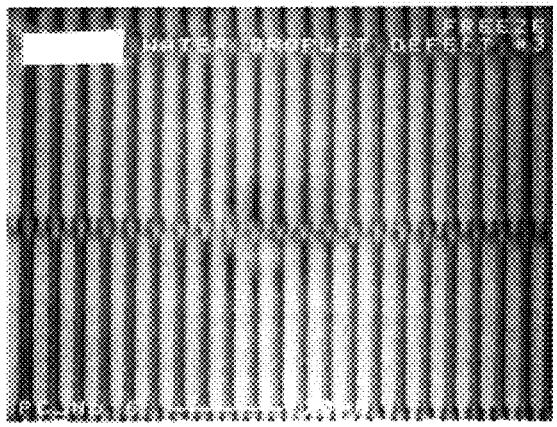
Figure 12D:
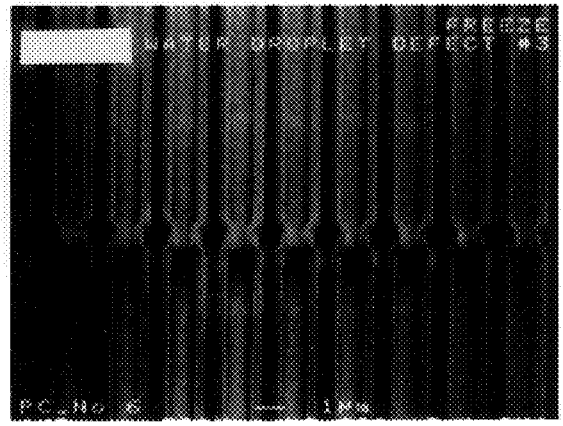

In order to change from an existing process to a new process, the following were done: a) In-line SEM CD comparison to see if the data changed between the new and old process, b) Resist profile comparison between two processes, c) Electrical defect monitor short-loop test, d) In-line photo defect monitor trend chart comparison. Graphs of the CDs between the old and new processes are shown in FIGS. 9A and 9B, respectively. FIGS. 9A and 9B show that the range of CDs for the two processes was similar and that by changing to the new process we would not be having any detrimental effect on CD uniformity. The resist profiles of the old and new processes, as seen in FIGS. 10A and 10B, respectively, also showed that the new process has similar profiles of the old process. These signs showed that, if defects in the new process were the same, then switching to the new process was adequate. Electrical defect monitor short-loop data showed similar results for both processes in terms of bridging defect density, minimum space opening and etch bias. Finally, the photo defect monitors for KLA were run daily to verify defect level. The monitor was run over a period of several days to obtain a trend chart. The trend chart comparing the defects of the two process is shown in FIG. 11. As seen by the trend chart, where the first set of data is for the old process and the latter set for new process, switching to the new process makes a significant improvement in defect density.

NON-KILLER DEFECT OBSERVATION

In addition to killer defects, non-killer defects must also be taken into consideration. Non-killer defects are defects that do not cause potential yield problems but are necessary to minimize in order to ensure defect stability. Through careful defect review, by use of TDI camera and SEM imaging, water droplet stains were found to exist on defect monitors. These non-killer defects were being left on the wafers due to an inadequate dry sequence. FIG. 12 shows SEM pictures of these defects. From these images, the difficulty in finding these defects was apparent. FIGS. 12A–12D are images of the same region under successively increasing magnification, respectively. Although a defect appears to be present at the center of FIGS. 12A–12C, FIG. 12D (highest magnification) shows that in fact there is no visual defect.

Figure 13:
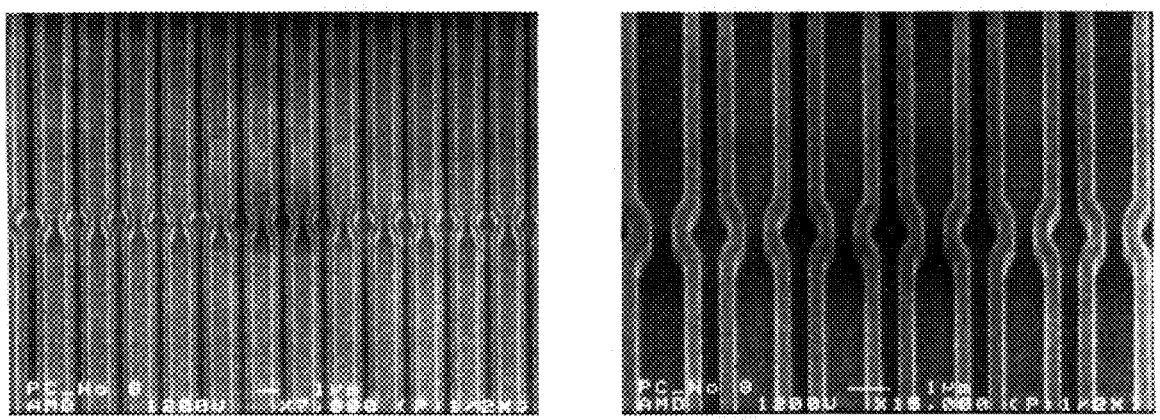
FIG. 13 illustrates SEM micrographs of resist patterns of a final develop process for an alternative processing specification.

In order to reduce the water stain defects, the rinse and dry steps of the develop process were further optimized. The rinse sequence was changed from a fast spin to a slower spin speed in order to reduce splashback while the dry speed was lowered to ensure that a more adequate dry sequence was obtained. These changes significantly reduced the number of water stain defects on each wafer and thus further optimized the develop process. FIG. 11 shows the trend chart of the final optimized develop process. From this chart, defect stability and reduction occur when this new develop process was implemented (day 18). FIG. 13 shows the SEM micrographs of the final develop process after this refinement. As shown in FIG. 13, there are no visual defects.

CONCLUSION

As demonstrated, the photo defect monitor is a valuable tool, not just for daily equipment/process control, but also for understanding and optimizing the defect performance of a particular photo process. The triple puddle/double rinse develop process for an I-line resist described in this paper is cleaner than the double puddle/single rinse process. However, there is a cost associated with this improvement. First, the additional development dispense will increase the chemical cleaner cost. Second, it is a time consuming process which reduces track equipment's throughput. However, the value of a cleaner process is considerable and sometime, must take priority over the secondary cost if it us used for the manufacturing of a high prized product like the microprocessor. Further work can be done to minimize the cost and throughout impacts.

Although the disclosed embodiment describes optimizing an I-line lithography process, the disclosed embodiment may be used for any wavelength application, such as DUV, X-ray, or E-beam lithography processing.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

We claim:

1. A method of reducing defects in a semiconductor fabrication process, comprising:

forming a pattern on a first silicon wafer using the semiconductor fabrication process according to a prescribed processing specification;

inspecting the pattern on the first silicon wafer to detect a first defect;

developing an alternative processing specification relative to the prescribed processing specification based on the first defect;

forming the pattern on a second silicon wafer using the semiconductor fabrication process according to the alternative processing specification;

comparing respective characteristics of the patterns on the first and second silicon wafers; and changing the semiconductor fabrication process to include the alternative processing specification based on the comparing step.

2. The method of claim 1, wherein the comparing step comprises:

determining a first defect density of the pattern on the first silicon wafer;

determining a second defect density of the pattern on the second silicon wafer; and determining whether the second defect density is less than the first defect density.

3. The method of claim 2, wherein the comparing step further comprises:

determining a first output parameter quality of the pattern on the first silicon wafer relative to prescribed design rules;

determining a second output parameter quality of the pattern on the second silicon wafer relative to the prescribed design rules; and determining whether the second output parameter quality at least matches the first output profile quality.

4. The method of claim 3, wherein the prescribed design rules specify at least one of physical dimensions, pattern profile, and etch bias.

5. The method of claim 3, wherein the prescribed design rules include an electrical characteristic of the pattern on the corresponding silicon wafer.

6. The method of claim 1, wherein the inspecting step comprises:

generating an image of the pattern on the first silicon wafer in an optical inspection tool; and generating a wafer map specifying location and size of the detected defect from the image of the test wafer.

7. The method of claim 6, wherein the image generating step comprises generating an image of the pattern using pixels having a dimension value corresponding to a maximum value of 0.39 microns.

8. The method of claim 6, wherein the inspecting step further comprises classifying the detected defect to a corresponding cause using a scanning electron microscope (SEM) inspection tool.

9. The method of claim 1, wherein the pattern forming steps for the first and second silicon wafers each comprise forming a repetitive pattern on the corresponding silicon wafer according to a prescribed design product rule.

10. A method of reducing defects in a lithographic process, comprising:

forming a resist pattern on a first silicon wafer using the lithographic process according to a prescribed processing specification;

inspecting the resist pattern on the first silicon wafer to detect a first defect;

developing an alternative processing specification relative to the prescribed processing specification based on the detected first defect;

forming the resist pattern on a second silicon wafer using the lithographic process according to the alternative processing specification;

comparing respective characteristics of the resist patterns on the first and second silicon wafers; and changing the lithographic process to include the alternative processing specification based on the comparing step.

11. The method of claim 10, wherein the comparing step comprises:

determining a first defect density of the resist pattern on the first silicon wafer;

determining a second defect density of the resist pattern on the second silicon wafer; and determining whether the second defect density is less than the first defect density.

12. The method of claim 11, wherein the comparing step further comprises:

determining a first output parameter quality of the pattern on the first silicon wafer relative to prescribed design rules;

determining a second output parameter quality of the pattern on the second silicon wafer relative to the prescribed design rules; and determining whether the second output parameter quality at least matches the first output profile quality.

13. The method of claim 12, wherein the prescribed design rules specify at least one of physical dimensions, pattern profile, and etch bias.

14. The method of claim 12, wherein the prescribed design rules include an electrical characteristic of the resist pattern on the corresponding silicon wafer.

15. The method of claim 10, wherein the inspecting step comprises:

generating an image of the resist pattern on the first silicon wafer in an optical inspection tool; and generating a wafer map specifying location and size of the detected defect from the image of the test wafer.

16. The method of claim 15, wherein the image generating step comprises generating an image of the resist pattern using pixels having a dimension value corresponding to a maximum value of 0.39 microns.

17. The method of claim 15, wherein the inspecting step further comprises classifying the detected defect to a corresponding cause using a scanning electron microscope (SEM) inspection tool.

18. The method of claim 10, wherein the resist pattern forming steps for the first and second silicon wafers each comprise forming a repetitive pattern on the corresponding silicon wafer according to a prescribed design product rule.

* * * * *